(12) United States Patent
Delamarche et al.

(10) Patent No.: US 10,675,620 B2
(45) Date of Patent: Jun. 9, 2020

(54) FABRICATION OF MICROFLUIDIC CHIPS HAVING ELECTRODES LEVEL WITH MICROCHANNEL WALLS

(71) Applicants: International Business Machines Corporation, Armonk, NY (US); UNITEC SEMICONDUCTORES S.A., Rio de Janerio (BR)

(72) Inventors: Emmanuel Delamarche, Rueschlikon (CH); Tobias Guenzler, Rio de Janerio (BR); Yuksel Temiz, Rueschlikon (CH); Tino Treiber, Rio de Janerio (BR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/231,817

(22) Filed: Dec. 24, 2018

(65) Prior Publication Data

US 2019/0143321 A1  May 16, 2019

Related U.S. Application Data

(62) Division of application No. 14/901,699, filed as application No. PCT/IB2014/062343 on Jun. 18, 2014, now Pat. No. 10,159,976.

(30) Foreign Application Priority Data

Jun. 28, 2013 (GB) .................................. 1311676.9

(51) Int. Cl.
*B01L 3/00* (2006.01)
*H01L 21/302* (2006.01)
(Continued)

(52) U.S. Cl.
CPC ........ *B01L 3/502707* (2013.01); *B05D 1/005* (2013.01); *B81C 1/00119* (2013.01);
(Continued)

(58) Field of Classification Search
CPC . H01L 21/302; H01L 37/32009; B05D 1/005; B81C 1/00119; B01L 3/00; B01L 3/502707; H01J 37/32009
(Continued)

(56) References Cited

U.S. PATENT DOCUMENTS 7,452,713 B2  11/2008 Barlocchi et al.
8,021,961 B2   9/2011 Sparks
(Continued)

OTHER PUBLICATIONS

Hermes et al., "Fabrication of microfluidic networks with integrated electrodes", Microsystem Technologies; Micro and Nanosystems Information Storage and Processing Systems, Springer, Berlin, DE, vol. 12, No. 5, Apr. 1, 2006.
(Continued)

*Primary Examiner* — Brian J. Sines
(74) *Attorney, Agent, or Firm* — Scully, Scott, Murphy & Presser, P.C.

(57) ABSTRACT

The present invention is notably directed to method of fabrication of a microfluidic chip, comprising: providing a substrate, a face of which is covered by an electrically insulating layer; obtaining a resist layer covering one or more selected portions of the electrically insulating layer, at least a remaining portion of said electrically insulating layer not being covered by the resist layer; partially etching with a wet etchant a surface of the remaining portion of the electrically insulating layer to create a recess and/or an undercut under the resist layer; depositing the electrically conductive layer on the etched surface, such that the electrically conductive layer reaches the created recess and/or undercut; and removing the resist layer to expose a portion of the electrically insulating layer adjoining a contiguous portion of the electrically conductive layer. The present invention is further directed to microfluidic chips obtainable by such methods.

7 Claims, 4 Drawing Sheets

(51) Int. Cl.
*B81C 1/00* (2006.01)
*B05D 1/00* (2006.01)
*H01J 37/32* (2006.01)

(52) U.S. Cl.
CPC . *H01J 37/32009* (2013.01); *B01L 2200/0668* (2013.01); *B01L 2200/0684* (2013.01); *B01L 2200/12* (2013.01); *B01L 2300/0645* (2013.01); *B01L 2300/0816* (2013.01); *B01L 2300/0887* (2013.01); *B01L 2300/161* (2013.01); *B01L 2400/0406* (2013.01); *B01L 2400/0418* (2013.01); *B81B 2201/058* (2013.01); *B81B 2203/04* (2013.01); *H01J 2237/334* (2013.01)

(58) Field of Classification Search
USPC ...... 422/502, 503, 504; 438/8, 9, 40, 42, 43, 438/443, 444, 494, 498, 504, 634, 673, 438/689, 695, 739, 740, 749
See application file for complete search history.

(56) References Cited

U.S. PATENT DOCUMENTS

| | | |
|---|---|---|
| 8,153,085 B2 | 4/2012 | Hwang et al. |
| 8,563,325 B1 | 10/2013 | Bartsch et al. |
| 2005/0273995 A1 | 12/2005 | Kanagasabapathi et al. |
| 2007/0015179 A1 | 1/2007 | Klapperrich et al. |
| 2007/0102293 A1 | 5/2007 | Tai et al. |
| 2010/0055673 A1 | 3/2010 | Agarwal et al. |
| 2014/0023566 A1 | 1/2014 | Nakano et al. |
| 2014/0044900 A1 | 2/2014 | Sparks et al. |
| 2014/0079602 A1 | 3/2014 | Ono |

OTHER PUBLICATIONS

Kim et al., "Simple Route to Hydrophilic Microfluidic Chip Fabrication Using an Ultraviolet (UV)-Cured Polymer", Materials Science, General & Introductory Materials Science, Advanced Functional Materials, vol. 17, Issue 17, pp. 3493-3498, Nov. 2007, http://onlinelibrary.wiley.com/doi/10.1002/adfm.200601203/abstract (Abstract Only).

Kalkandjiev et al., "Hybrid Fabrication of Microfluidic Chips Based on COC, Silicon and TMME Dry Resist", 2010 IEEE 23rd International Conference on Micro Electro Mechanical Systems (MEMS), Jan. 24-28, 2010, pp. 400-403.

List of IBM Patents or Patent Applications Treated As Related, dated Dec. 24, 2018, pp. 2.

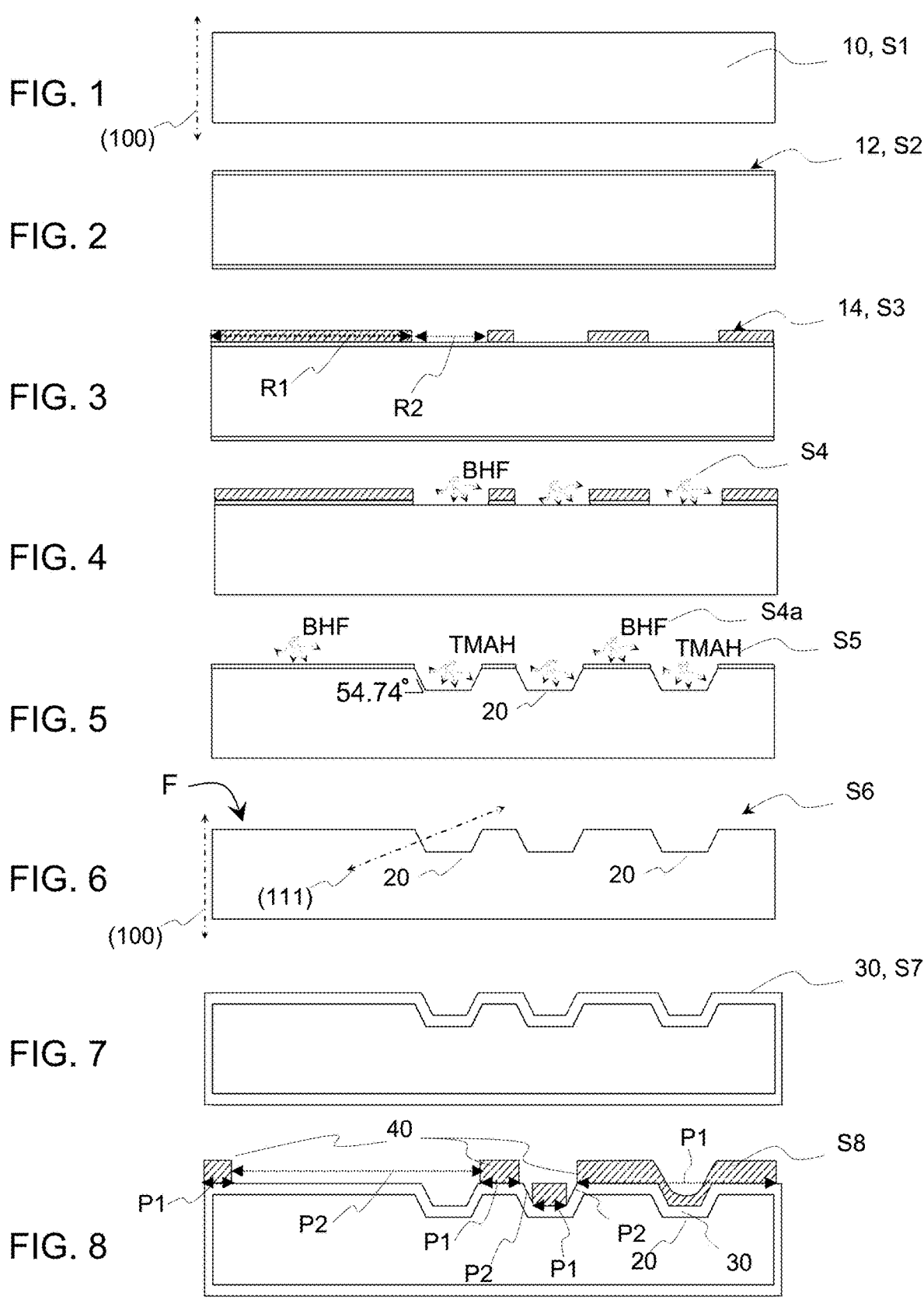

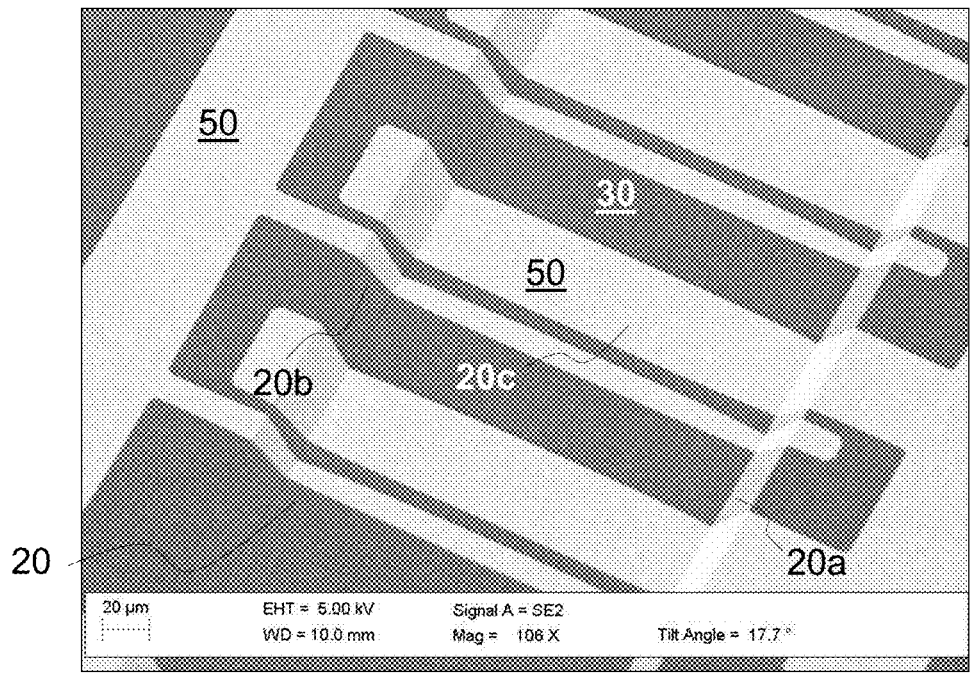
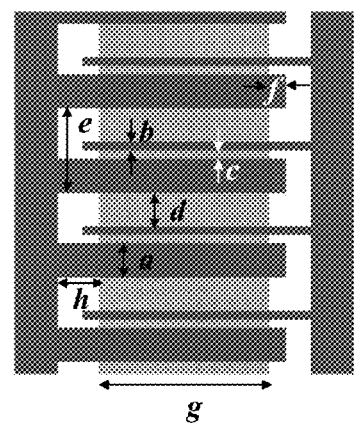
FIG. 14

FABRICATION OF MICROFLUIDIC CHIPS HAVING ELECTRODES LEVEL WITH MICROCHANNEL WALLS

FIELD OF THE INVENTION

The invention relates in general to the field of methods of fabrication of microfluidic chips. It is in particular directed to wafer-based fabrication of microfluidic chips and to the fabrication of chips having electrodes extending through microstructures and microchannels thereof.

BACKGROUND OF THE INVENTION

Microfluidics generally refers to microfabricated devices, which are used for pumping, sampling, mixing, analyzing and dosing liquids. Prominent features thereof originate from the peculiar behavior that liquids exhibit at the micrometer length scale. Flow of liquids in microfluidics is typically laminar. Volumes well below one nanoliter can be reached by fabricating structures with lateral dimensions in the micrometer range. Reactions that are limited at large scales (by diffusion of reactants) can be accelerated. Finally, parallel streams of liquids can possibly be accurately and reproducibility controlled, allowing for chemical reactions and gradients to be made at liquid/liquid and liquid/solid interfaces. Microfluidics are accordingly used for various applications in life sciences.

The fabrication of microfluidic chips using semiconductor wafers such as Si wafers is attractive: one may expect to benefit from a range of existing processes, as continuously developed in the past decades for integrated circuits, to obtain accurate microfluidic structures. However, contrary to what is done in semiconductor wafer processing, microfluidics generally have deep structures, i.e., around a few micrometers, up to 20 micrometers or even deeper. In many cases, 5 micrometers is already considered as a small depth in microfluidic applications because such a small depth can generate a large hydraulic resistance on a liquid and can block or become clogged with microbeads and particles, such a small depth can also be incompatible with samples containing cells. As a result, existing semiconductor wafer processes are challenged by, if not incompatible with the requirements needed for microfluidic chip fabrication both in terms of manufacturing processes and cost of fabrication.

In many microfluidic applications, metallic patterns are desirable, e.g., for performing electrochemistry and electro-based detection of analytes, for electrical separation of analytes, or for moving liquids using electro-osmotic flow (EOF), performing dielectrophoresis (DEP), etc. Thick resists (e.g. SU-8) can sometimes be used to directly form sidewalls of deep structures. However, such thick resists have several drawbacks, as present inventors have realized.

BRIEF SUMMARY OF THE INVENTION

According to a first aspect, the present invention is embodied as a method of fabrication of a microfluidic chip, comprising:
providing a substrate, a face of which is covered by an electrically insulating layer; obtaining a resist layer covering one or more selected portions of the electrically insulating layer, at least a remaining portion of said electrically insulating layer not being covered by the resist layer;
partially etching with a wet etchant a surface of the remaining portion of the electrically insulating layer to create a recess and/or an undercut under the resist layer; depositing an electrically conductive layer on the etched surface, such that the electrically conductive layer reaches the created recess and/or undercut; and
removing the resist layer to expose a portion of the electrically insulating layer adjoining a contiguous portion of the electrically conductive layer.

In embodiments, the substrate provided exhibits a microstructure machined on said face (F), such as a microfluidic microchannel grooved on said face, and obtaining the resist layer is carried out such that the remaining portion extends at least partly, preferably only partly, over the microstructure, whereby the electrically conductive layer deposited next covers at least partly the microstructure.

Preferably, at the step of partially etching the surface of the electrically insulating layer, the wet etchant is applied such that: an etch depth corresponds to a desired thickness of an electrically conductive layer to be deposited next; and an average depth of the created recess and/or undercut is on the same order of magnitude as a depth of the deposited conductive layer, the wet etchant and the electrically insulating layer being such that the etching process at the step of partially etching is an isotropic etching process.

In preferred embodiments, the electrically insulating layer covering the substrate provided is an oxide such as $SiO_2$ or a nitride such as $Si_3N_4$ and the wet etchant used for partially etching the surface of the remaining portion of the electrically insulating layer is a buffered oxide etch.

Preferably, the thickness of the deposited conductive layer is between 20 and 200 nm, more preferably between 30 and 100 nm, and even more preferably between 40 and 60 nm, the deposited electrically conductive layer being preferably one of: a metal, a metallic alloy, or an organic layer.

In embodiments, the electrically conductive layer is deposited using a directional evaporation technique, whereby the electrically conductive layer is evaporated perpendicularly to the average plane of the electrically conductive layer.

Preferably, the substrate provided exhibits a microfluidic microchannel grooved on said face, the average depth of the microchannel being between 5 and 50 micrometers, and more preferably the average depth of the microchannel of the substrate provided is between 10 and 20 micrometers.

In preferred embodiments, the microchannel of the substrate provided has slanted sidewalls.

In embodiments, providing the substrate comprises creating the microfluidic microchannel by:
providing a substrate;
obtaining an initial electrically insulating layer covering said face of the substrate; and
obtaining a resist layer covering a selected region of said initial electrically insulating layer, whereby a remaining region of said initial electrically insulating layer is not covered by the resist layer; and
etching the initial electrically insulating layer and the substrate in the remaining region to obtain said microfluidic microchannel grooved on said face of the substrate.

Preferably, providing the substrate further comprises at least one, preferably two steps of oxidizing the substrate, preferably by thermal oxidation, to obtain said face covered by an electrically insulating layer.

In preferred embodiments, the substrate provided is a silicon wafer, said face of the substrate being generally parallel to surfaces of the silicon wafer.

Preferably, the method further comprises steps of
oxidizing the substrate of silicon by thermal oxidation to obtain a $SiO_2$ insulating layer; and
etching the $SiO_2$ insulating layer with a wet etchant such as a buffered hydrogen fluoride solution and performing anisotropic silicon etching, preferably with tetramethylammonium hydroxide, to obtain a microfluidic microchannel with slanted sidewalls, the microchannel grooved on the face of the substrate.

According to another aspect, the invention is embodied as a microfluidic chip obtainable according to the method of any one of the above embodiments, the microfluidic chip comprising:
a substrate exhibiting one or more microstructures machined on a face of the substrate, such as microfluidic microchannels;
an electrically insulating layer covering at least partially said face;
an electrically conductive layer covering at least partly the electrically insulating layer, and preferably covering the electrically insulating layer over an area extending at least partly over of the one or more microstructures, wherein an exposed surface of the electrically conductive layer is adjoining, preferably level with, an exposed surface of a contiguous portion of the electrically insulating layer, the misalignment between said exposed surfaces being preferably less than 20 nm, and even more preferably less than 10 nm.

Preferably, the electrically conductive layer abuts a contiguous portion of the electrically insulating layer, subject to a residual void due to a recess and/or an undercut created during the fabrication of the chip according to a method of any one of the above embodiments.

Devices and methods embodying the present invention will now be described, by way of non-limiting examples, and in reference to the accompanying drawings. Technical features depicted in the drawings are not to scale.

BRIEF DESCRIPTION OF SEVERAL VIEWS OF THE DRAWINGS

FIGS. 1-11 schematically illustrate high-level steps of a method of fabrication of a microfluidic chip, according to embodiments;

FIG. 14 is a scanning electron microscope image of a microchannel of a microfluidic chip, wherein electrodes extend through the channel, level with walls thereof.

DETAILED DESCRIPTION OF THE INVENTION

Figure 9:
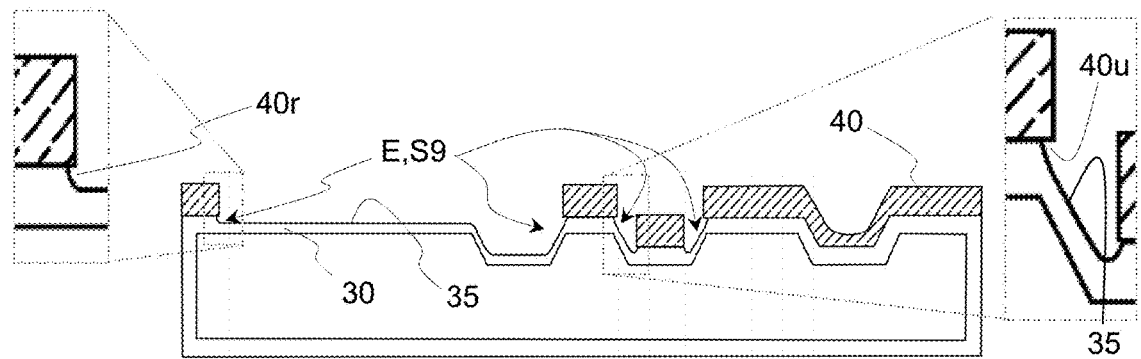

The following description is structured as follows. First, some difficulties that present inventors observed with conventional methods are discussed. General embodiments of the proposed solution, emphasizing prominent features of this invention, and high-level variants are then described (sect. 2). The next section addresses more specific embodiments and technical implementation details (sect. 3), including a chronological description of FIGS. 1-11.

1. Difficulties Observed with Conventional Methods Using Thick Resists

As present inventors have realized, the use of thick resists for fabricating microfluidic chips is inconvenient, notably due to their limited temperature and chemical stability. It is furthermore difficult to tailor the surface chemistry of these resists (e.g. for controlling wetting, or the adhesion of biomolecules and cells). In addition, processing thick resists requires using more resist, longer backing, exposure and development steps, and also sometimes requires multiple spin coating steps. The mechanical properties and internal stress of such resists is also an issue during microfluidic chip fabrication and utilization.

Besides, it is another challenge to pattern metals in and/or across structures having depths around or in excess of 5 micrometers due to (1) the inhomogeneity in thickness of resists (used as sacrificial layers for lift-off) that are deposited across deep structures and (2) the difficulty of patterning metals using lift-off techniques, especially in channels having vertical sidewalls.

For instance, scanning electron microscope (SEM) images were obtained for 15 μm deep structures wet etched in a Si (100) wafer using tetramethylammonium hydroxide (TMAH) and patterned with Al. 5 nm of Ti and 50 nm of Al were e-beam evaporated onto a patterned thick resist (AZ4562, 4 μm thick on the surface) and partially removed by lift-off of the resist. Several defects in the Al patterns were clearly visible in some cases: notably shorts and narrowings. Such defects may result from the inhomogeneous thickness of the resist and proximity effects.

During spin coating of the resist, some areas (especially raised areas near etched channels having L or U shaped) could not be covered. It was, therefore, not possible to prevent metal from sticking in these uncovered areas. These defects in metal patterning may lead to short-circuits if they are close to the metal patterns. As a result, a minimal gap of approximately 100 micrometer and preferably 200 micrometer with surrounding electrically-connected patterns had to be implemented in the chip layout.

Inventors concluded to the need for new methods of fabrication of microfluidic chips, allowing for satisfactorily patterning electrodes (or more generally electrically conductive patterns) thereon, even in and/or across structures having depths around or in excess of 5 micrometers.

2. General Embodiments of the Proposed Solution and High-Level Variants

In reference to FIG. 1-11, respectively corresponding to steps S1-S11, an aspect of the invention is first described, which concerns methods of fabrication of microfluidic chips that are compatible with semiconductor wafer processing techniques.

In their most general definitions, present methods consider, as a starting point, a substrate 10 (e.g., a Si wafer) having a face F covered by an electrically insulating layer 30 (e.g., $SiO_2$). How to obtain such a substrate is the subject of preliminary steps S1-S7 (FIGS. 1-7), which shall be discussed later. Steps S1-S7 are optional as several methods for obtaining a substrate covered by an electrically insulating layer are known in the art.

First, a resist layer 40 is obtained, which layer covers one or more selected portions P1 of the electrically insulating layer 30, as seen in FIG. 8. Accordingly, there will be at least a remaining portion P2 of the electrically insulating layer 30 that is not covered by the resist layer 40. The selected portion(s) P1 may be given various possible shapes, resulting in complementary shapes for portion(s) P2, as desired for the electrically conductive layer to be deposited next. Methods are known in the art, which allow for obtaining such a resist layer. Preferred (novel) methods for obtaining such a resist layer are discussed later.

The next step S9 is key: it comprises partially etching a surface of the remaining portion(s) P2 of the electrically insulating layer 30 with a wet etchant E, in order to create a recess 40r and/or an undercut 40u under the resist layer 40, i.e., at an interface (or border) between the resist 40 and layer 30. The etched surface that results is denoted by reference 35 in FIG. 9.

Figure 10:
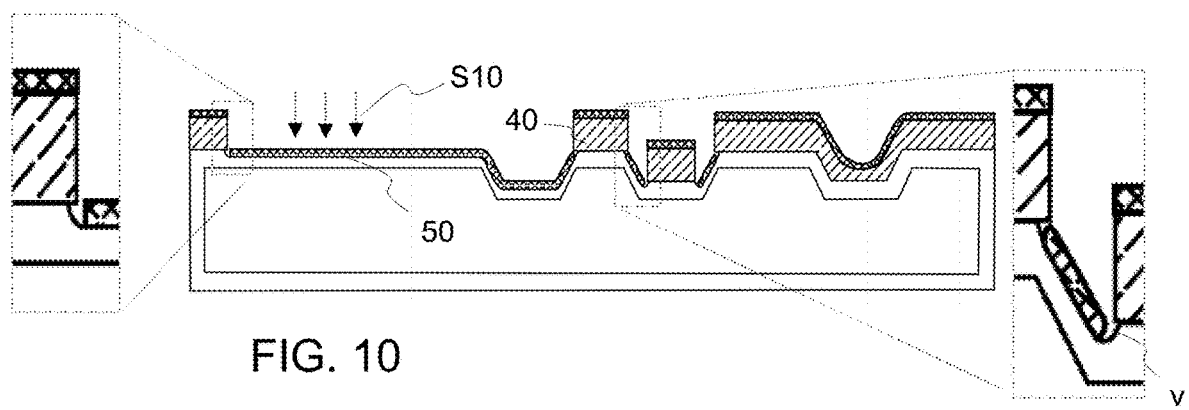

Then, an electrically conductive layer 50 is deposited S10 on the etched surface 35 (FIG. 10). The deposition of the layer 50 is such that the electrically conductive layer reaches the created recess 40r and/or undercut 40u (i.e., without substantially filling the recess/undercut).

Finally, the resist layer 40 can be removed (lift-off), step S11 (FIG. 11), in order to expose a portion P1 of the electrically insulating layer adjoining a contiguous portion P2 of the electrically conductive layer 50.

By construction, the recess and/or undercut is located at the level of an interface, i.e., a frontier between the electrically insulating layer and the resist layer. This recess and/or undercut furthermore extend along a periphery, or a border of the remaining portion P2, that is, perpendicularly to the section shown in FIG. 9. Present inventors realized that such a recess and/or undercut is key for obtaining neat frontiers between the insulating and conductor layers.

In fact, an explanation is that recesses/undercuts substantially lower the risk of defects at the frontier between the conductive and insulator layers, which then enable an easier lift-off (continuous metal film deposition over the resist 40 is prevented), and in turn allows for nicely flush surfaces to be obtained. In addition, there is no need for a double-layer resist as usually done in the art.

Typically in the art, two layers of resist are used to achieve something that would be comparable, if were not the dimensions required for microfluidic structures. Namely, a non-photosensitive resist layer is first coated on a substrate, and then a photosensitive resist (photoresist) layer is applied. During the development step, the developer etches away the exposed photoresist and also isotropically etches the non-photosensitive layer, creating an undercut. In this approach, the non-photosensitive layer has to be a very thin layer (less than 1 µm) and conformal coating of such a thin film in the presence of microfluidic channels is impossible in practice with spin-coating techniques. Moreover, double layer resist processing requires more time since the coating and soft baking steps have to be done twice.

With present methods, a single photoresist layer can be used, which for instance is spin-coated in a closed chamber coating system for better step-coverage of the resist, particularly on the channel sidewalls. Inventors concluded that resist thickness inside the channels should be about half the channel depth to obtain an optimal conformal photoresist layer. Although not shown in the appended drawings, the resist thickness on the surface is less than the resist thickness inside the channels, manifestly due to the accumulation of resist inside the channels during spin-coating.

For example, for 20 µm deep channels, resist thickness is about 10 µm inside the channels and about 5 µm on the top surface (resist thickness is typically larger inside the channels, as the resist cannot spread as on the surface and accumulates more). Thus, an optimal resist thickness shall preferably be chosen according to the initial channel depth.

In this respect, the variation in the thickness of the resist 40 can lead to photolithographic imaging errors. For instance, if the exposure dose and the development time are optimized for a thicker part of the resist layer 40, then thinner parts of that same layer may be over-exposed and developed, resulting in pattern widening and potential short-circuits after metal patterning. This can be compensated by mask (layout) correction.

Moreover, in the case of contact lithography, although the photomask is in direct contact with the resist layer on the surface, there is a varying gap on the slanted sidewalls and a fix gap at the bottom of the channel, resulting in non-uniform photolithography resolution inside the microfluidic structures. The projection of the drawn pattern (on the photomask) to the slanted channel sidewall is also different than a planar surface. These irregularities too can be compensated by mask (layout) correction so that the final pattern on the photoresist can be made close to the desired one.

Of particular advantage is that the above methods furthermore make it possible to obtain an electrically conductive layer that is level with the contiguous electrically insulating layer, e.g., subject to a very small misalignment that, in practice, is typically less than ±10 nm (and less than ±20 nm in practically all cases). Where a recess/undercut was located before removal of the resist layer 40, the electrically conductive layer 50 adjoins, i.e., abuts a contiguous portion of the electrically insulating layer 30, subject to a residual void v. Some applications may require creating recesses only, undercuts only, or both, depending on desired microstructures, if any. Note that the concept of "microfluidic structures" (also "microfluidic features") is widely used in the literature to denote such features as: microfluidic microchannels, liquid loading pads, electrical contact openings, capillary pumps, etc.

The conductive layer 50 is likely a metal or an alloy, though conductive organic materials can be contemplated too. The insulating layer is typically an oxide e.g., of the material used for the substrate 10. However, nitrides can be contemplated too, e.g., silicon nitride. Silicon nitride can for instance be well deposited and is an excellent insulator. Yet, it does not create a particularly wettable surface, which can be an issue if capillary-driven flows are needed. Still, LPCVD-deposited silicon nitride may have a contact angle of about 40-50°. Thus, $SiO_2$ is preferred, especially when micro-structures (e.g., microchannels) have to be wettable, a thing that is particularly useful for many microfluidic applications. Therefore, advantage can be taken of the favorable properties of Si and $SiO_2$, such as thermal and chemical stability, mechanical robustness, compatibility of $SiO_2$ surface with many biomolecules, and well defined and reliable chemical composition.

In embodiments, the substrate 10 provided (at S7, FIG. 7) has one or more microstructures machined on face F of the substrate 10 (see FIG. 6), e.g., microfluidic microchannels 20. The step S8 of obtaining the resist layer 40 may in that case be carried out such that the remaining portion P2 extends at least partly, preferably only partly, over the microchannel 20. Accordingly, the electrically conductive layer 50 deposited next (step S10) shall cover at least partly the microchannel 20.

Note that microstructures are hereafter assumed to be microfluidic microchannels 20 grooved on said face F, for illustration. Embodiments of the present invention nevertheless apply to other types of microstructures as well (liquid loading pads, capillary pumps, etc.): for example, electrodes could be patterned that extend through passive capillary pumps, e.g., provided as enlarged section openings filled with capillary structures.

Figure 11:
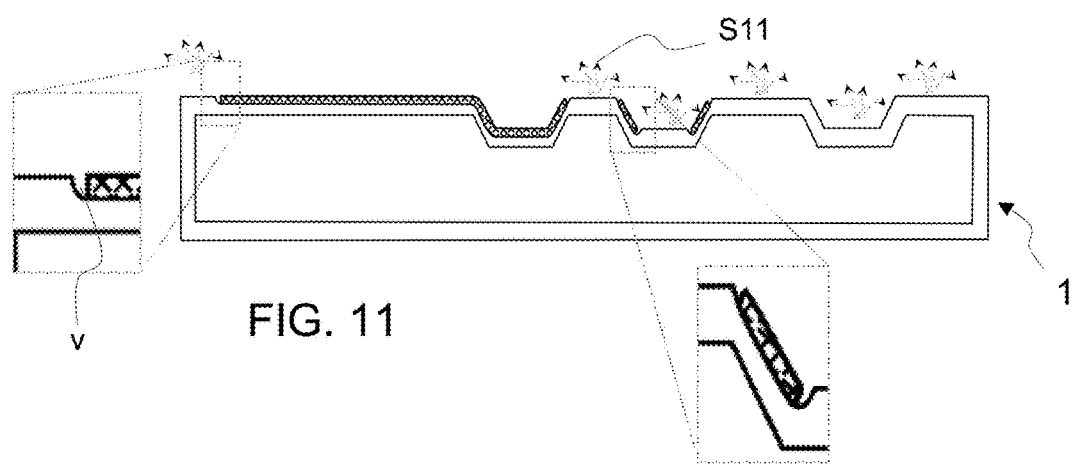
Figure 12:
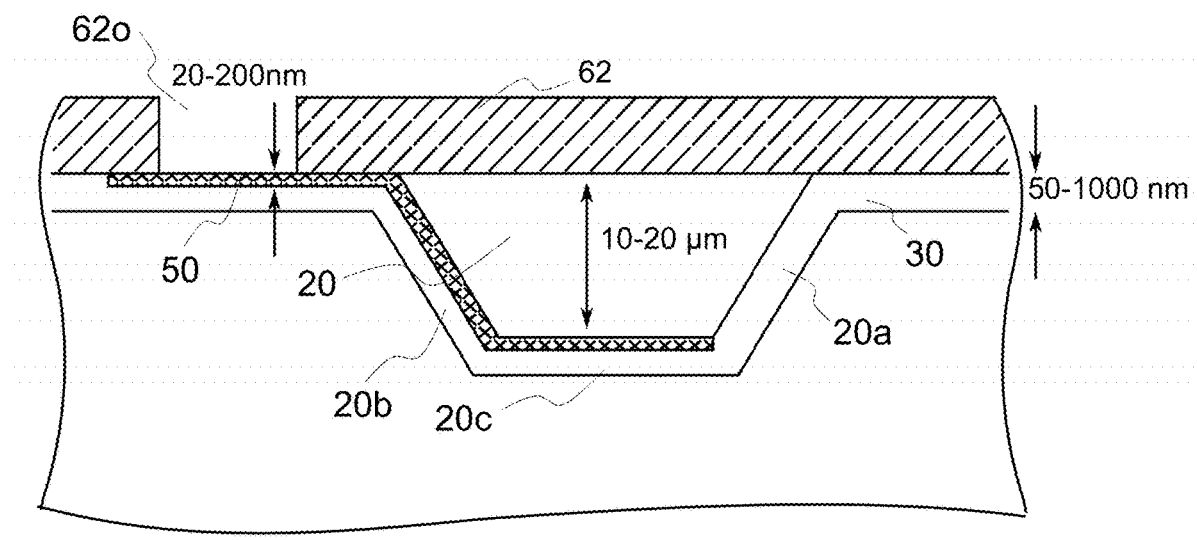
FIG. 12 is a 2D cross-sectional view (partial) of a simplified representation of a microfluidic chip, according to embodiments.

Having only a partially covered microchannel segment (see FIGS. 12-13) allows for obtaining electrodes for which the electric field can be locally shaped, a thing that is advantageous for some applications e.g., microbead trapping and manipulation. Meanwhile, such electrodes can be obtained flush with the surrounding surfaces 20*a*, 30. This has several advantages: notably, flush electrodes do not perturb the liquid flow and ease the sealing of the structures with a cover film 62, see FIG. 12. An electrode 50 could for instance extend through a first slanted wall 20*b*, then through the basis surface 20*c* of the channel and stop at an end thereof, as seen in FIG. 12. On the other hand, other applications may not need this and so the conductive layer 50 may extend through the entire section 20*b*-20*c*-20*a* of a channel as in FIG. 11 or 14. Still, electrodes may extend trough lateral walls 20*a*, 20*b* only, and not through the basis surface 20*c*, to obtain lateral, opposite electrodes (as seen in FIG. 11). One understands that various patterns of flush conductive layers can accordingly be obtained.

In embodiments, at step S9 (FIG. 9, partial etching of the surface of layer 50), the wet etchant E is applied such that an etch depth corresponds to a desired thickness of the electrically conductive layer 50 to be deposited next. In addition, the etchant is applied such that the average depth of the created recess and/or undercut is on the same order of magnitude as the thickness of the conductive layer 50 deposited next (the resist layer 40 being substantially thicker). To that aim, the wet etchant and the electrically insulating layer can be chosen such as for the etching process to be isotropic. This notably prevents physical notches to appear at the edges of the electrically conducting material, e.g., metal, after lift-off, and in turn results in neat borders between the conductive and insulating layers. This, it will be appreciated, prevents in turn spurious electrical fields at the border as smoother edges result in a more uniform electric field.

The etching process may be isotropic, if the nature, e.g., non-perfectly ordered, of the insulating layer permits (as is the case with e.g., $SiO_2$, $Si_3N_4$, etc.), a thing that greatly simplifies the monitoring of the etch depth as the depth of the recesses/undercuts shall be essentially identical to the vertical etch depth. The etching process is typically solely time-based in that case, i.e., without etch stop layers or the like. The etch rate may need to be measured for a given chemistry and conditions; then, the etching process is run during an appropriate time and stopped.

As evoked earlier, the electrically insulating layer 30 that covers the substrate provided is preferably an oxide such as $SiO_2$ or a nitride such as $Si_3N_4$. In such cases, the wet etchant E used for partially etching S9 the surface of the remaining portion P2 of insulating layer 30 is a buffered oxide etch. A buffered oxide etch is a wet etchant that can be used in etching thin films of oxides or nitrides such as mentioned above. It is a mixture of a buffering agent, such as ammonium fluoride $NH_4F$, and hydrofluoric acid HF, which allows for good process control. The buffered oxide etch may for example be a buffered hydrogen fluoride solution e.g., when used to etch $SiO_2$. It is hereafter referred to as BHF, for short.

Figure 13:
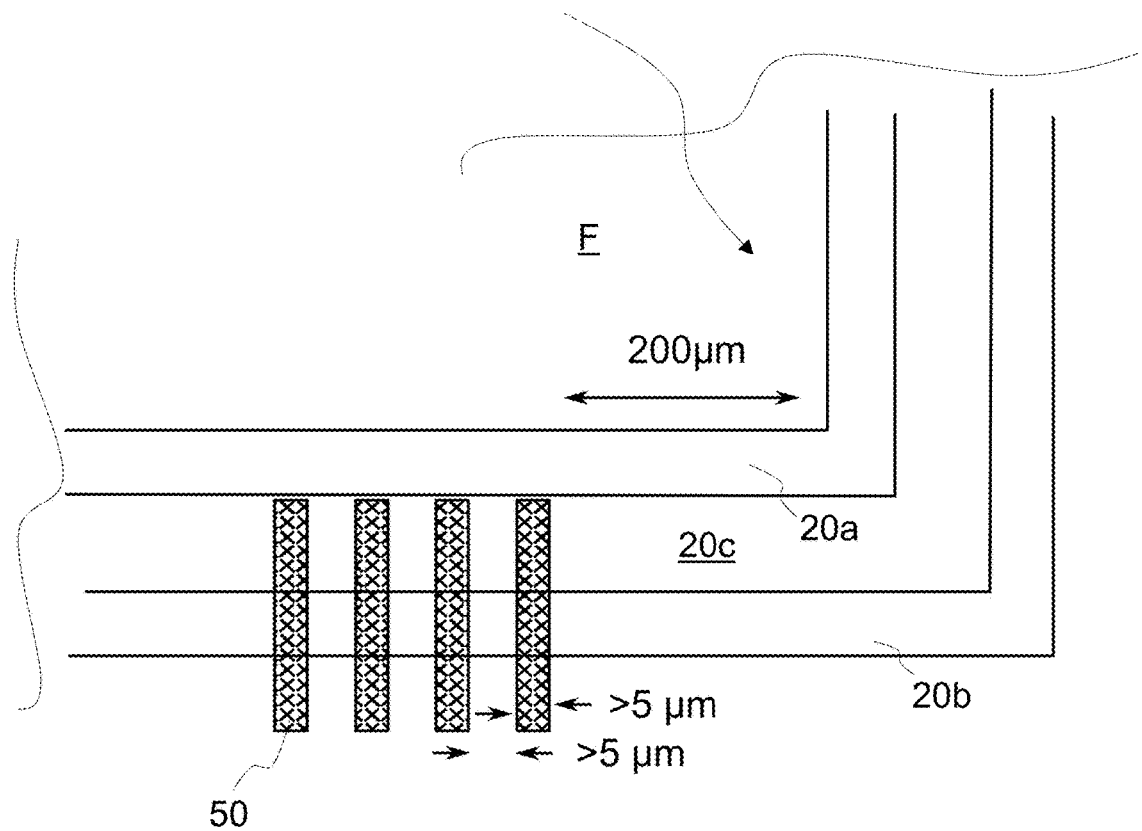
FIG. 13 is a 2D view (partial), from above, of the microfluidic chip of FIG. 12.

Referring now to FIGS. 12-13: the thickness of the deposited conductive layer 50 is preferably between 20 and 200 nm. As present inventors have experimentally verified, thicknesses of 50±10 nm already provides an excellent conductivity in practice, according to tests performed by present inventors, while on the other hand there is not much material to deposit. An additional benefit of limiting the thickness of the conductive layer is that the residual void v at the interface conductive layer/insulating layer will be small (illustrations of this residual void in FIGS. 10-11 are not to scale). For this reason, and taking into account other parameters that impact the efficiency of the process, a reasonable upper limit to the thickness of the deposited conductive layer is 200 nm. More efficient deposition processes are nonetheless achieved with thicknesses less than 100 nm. On the other hand, measuring the residual variability in the deposition process, present inventors concluded that minimal thicknesses shall preferably be larger than 20 nm, and more preferably larger than 30 nm.

In that respect, a directional evaporation technique is preferred, like electron-beam (or e-beam) evaporation techniques, where the electrically conductive layer is evaporated perpendicularly to the average plane of the target. Instead of e-beam evaporation, sputtering techniques or other techniques could also be used. These, however, are less directional than e-beam evaporation. Non-directional deposition techniques require additional care; a risk with such techniques being to make the conductive layer 50 conformal with the resist 40, contrary to vertical evaporation, which renders the subsequent lift-off step S11 more difficult. This is why directional evaporation, i.e., perpendicular to the surface, is preferred.

The substrate 10 provided S7 for implementing the above methods preferably exhibits a microfluidic microchannel 20 grooved on face F. The average depth of the microchannel 20 (or any microstructure to be processed according to present methods) is between 5 and 50 μm. Contrary to usual semiconductor wafer processing, microfluidics generally have deep structures, i.e. around a few micrometer, up to 20 μm or even more, e.g., 50 μm. In many cases, 5 μm is already a small depth in applications as contemplated herein. There are multiple reasons. For instance, a small depth can generate a large hydraulic resistance on a liquid and can block or become clogged with microbeads and particles. Such a small depth can also be incompatible with samples containing cells. A good compromise that was found to suit many applications is to provide microstructure depths between 10 and 20 μm.

Present deposition methods are particularly adapted for such depths, as opposed to conventional wafer processing techniques. The microchannels 20 may have slanted sidewalls, a thing that does not limit applicability of the present methods, as illustrated in FIG. 12, for patterning electrodes extending therethrough.

Other electrical circuits components like electrical pads and connections can be patterned at the same process stage, i.e., during the same steps as for the electrode patterning, and already described above.

At present, more shall be said about the pre-processing steps S1-S7. To start with, and in reference to FIGS. 1-5, said pre-processing steps may notably comprise a series of steps for creating microfluidic microchannels (or more generally microstructures). This can be achieved by providing S1 an initial substrate 10;

obtaining S2 an initial electrically insulating layer 12 covering the face F of the substrate;

obtaining S3 a resist layer 14 covering a selected region R1 of the initial electrically insulating layer 12, such that a remaining region R2 of said initial electrically insulating layer 12 is not covered by the resist layer 14; and etching S4-S5 the initial electrically insulating layer 12 and the substrate 10 in the remaining region R2, such as to obtain a microfluidic microchannel grooved on the face F of the substrate.

The substrate 10 can next be covered by an electrically insulating layer 30, step S7. The latter is preferably obtained by oxidizing the substrate 10, e.g., by thermal oxidation. The same considerations apply to step S2.

The substrate 10 is preferably a silicon wafer, where the face F is generally parallel to (100) surfaces of the Si wafer. In that case the pre-processing steps may comprise:
- oxidizing S2 the Si substrate 10 of silicon by thermal oxidation, to obtain $SiO_2$ as an insulating layer 12; and etching S4 the $SiO_2$ layer with a wet etchant, e.g., a buffered hydrogen fluoride solution,
- at step S5, anisotropic silicon etching S5 is performed, preferably with tetramethylammonium hydroxide (or TMAH), which results in microchannels 20 having slanted sidewalls.

In more detail, the wafer used is preferably a <100> wafer with a flat in the <110> direction; thus the top surface has a normal in <100> direction. The face F is accordingly parallel to (100) planes, i.e., orthogonal to the (100) direction in the basis of the reciprocal lattice vectors (diamond structure for Si).

If it is not detrimental for the microfluidic structures, e.g., channels, to have slanted sidewalls, then wet etching of Si wafer with a <100> crystal orientation is preferred over dry etching techniques because wet etching is compatible with batch processing and therefore can be overall faster, depending on the number of wafers processed. Note that, wet etching is usually slower than dry etching, which can be much faster per wafer. The overall throughput thus depends on the number of wafers processed altogether. The $SiO_2$ mask etching step S4 can else be carried out by dry plasma etching. Anisotropic silicon etching step S5, FIG. 5 may be carried out with TMAH, potassium hydroxide (KOH), ethylenediamine pyrocatechol (or EDP), etc. However, TMAH is preferred because it has higher selectivity over the $SiO_2$ mask, also it does not contaminate the wafer. More specifically, contamination is due to metal ions, potassium in the case of KOH.

Prior to the anisotropic silicon etching S5, steps of wafer preparation may be involved, starting with a step of photoresist removal (wet or dry), and a short BHF dip, step S4a, to remove the oxide i.e., the native oxide (because the oxide is already etched in Step 4), as illustrated in FIG. 5. This step is particularly advantageous for TMAH etching since a thin layer of native oxide may otherwise impair the etching. It should anyhow remain clear that step S4a is performed first, followed e.g., by rinsing with deionized water, and then step S5 is done, i.e., BHF and TMAH steps are not concomitant, notwithstanding the depiction in FIG. 5.

The resulting slanted walls of the channels 20 are parallel to (111) surfaces in that case.

Then, $SiO_2$ mask removal step S6 can be achieved by dry plasma or wet etching. This step is advantageous when one wishes to obtain an insulating layer 30 as uniform as possible during subsequent step S7, e.g., consisting of a thermal $SiO_2$ growth on a bare Si surface.

Although Si wafers are preferred, considerations involved herein apply to other semiconductors, e.g., Group IV elemental (e.g., Ge) or compound semiconductors (e.g., SiGe), other compound III-V or II-VI materials, and their respective oxides or nitrides. For instance, GaAs and Ge can be etched anisotropically. Also, principles underlying present methods can be applied to some metallic wafers and respective oxide. However, metallic wafers are less practical. In particular, they may not exhibit comparable crystallographic uniformity in the wafer thickness. Still, one may for instance contemplate using $Al_2O_3$ surfaces. $Al_2O_3$ can be used as a thin-film dielectric (up to 100-200 nm), and deposited either by sputtering, or by atomic layer deposition (ALD). The latter is an expensive but high quality technique, very useful notably for research purpose.

At present, more shall be said about devices obtainable with the present fabrication methods, mostly in reference to FIGS. 12-14. According to another aspect, the invention can be embodied as a microfluidic chip 1 that typically comprises:
- a substrate 10, e.g., a Si wafer, exhibiting one or more microstructures, such as a loading pad, a passive capillary pump or a microfluidic microchannel 20 on a face F of the substrate, e.g., grooved in or structured on top of a surface of the substrate;
- an electrically insulating layer 30 (e.g., $SiO_2$) covering at least partially the substrate;
- an electrically conductive layer 50 (e.g., Al or Ti/Al), covering at least partly the electrically insulating layer 30, e.g., covering layer 30 over an area extending over a microchannel 20, possibly only partly.

As a result from the present fabrication methods, the exposed surface of the conductive layer 50 has neat frontiers, is adjoining and preferably level with the exposed surface of contiguous portions of the insulating layer 30 (e.g., a hydrophilic surface), as illustrated in FIG. 12 and otherwise seen in the SEM image of FIG. 14.

Various possible patterns may be given to the conductive layer (e.g., electrodes, connections, electric pads, etc.), all obtainable at a same fabrication stage. The patterns can be integrated within a superficial thickness of the chip, flush with the exposed surface of the surrounding layers. The misalignment can be made such as to be negligible, e.g., with respect to the depth of the microchannel 20, i.e., preferably 2, and ideally 3 orders of magnitude below. For instance, methods described herein allow for achieving misalignments that are less than 20 nm (and mostly less than 10 nm), whereas the channel depth typically is between 10 and 20 µm. This minimizes surface topography and thus favors laminar flows, which may be advantageous to prevent sticking of cells, beads or other particles along the flow path. Minimized surface topography is also advantageous to avoid pinning sites during the initial filling of a flow path by a liquid. This also reduces edge-defects on the electrodes and thus prevents spurious electric fields at the edges. It further favors efficient sealing by a cover 62 put on top, as illustrated in FIG. 12.

As a result from the fabrication methods, the conductive layer 50 abuts contiguous portions of insulating layers 30, subject to a residual void 40v. The latter arises due to the recesses/undercuts created during fabrication of the chip. The characteristic dimensions of the residual voids v are primarily determined by the recesses/undercuts. However, their dimensions may also depend on the deposition technique used, e.g., a vertical evaporation of the conductive layer on the surface. Of course, the precise geometry of the surface shall impact the residual voids too. In particular undercuts may give rise to slightly smaller or larger voids compared to recesses. Yet, residual voids shall in principle on the same order of magnitude as the recesses/undercuts.

The SEM image shown in FIG. 14 illustrates the quality of interfaces obtained. In this image:
- EHT stands for Electron High Tension in kilo-Volt, kV;
- WD denotes the working distance between the sample surface and the low portion of the lens;
- Mag is for magnification;
- Tilt Angle denotes the angle of the normal of the sample stage with respect to the axis of the electron gun; and
- Signal A=SE2 indicates that a detector of secondary electrons is used.

FIG. 14 shows (main image) a pattern of electroosmotic (EO) electrodes obtained thanks to present methods. Such electrodes form a repeating pattern of pairs of contiguous electrodes (each electrode of a pair connected to a respective comb), that extend transverse to the flow path. The microchannel is 200 µm wide and 22 µm deep. EO electrodes' pairs comprise electrodes that differ in their dimensions. Electrodes are preferably made, each, essentially of aluminum. If the hydrophilic surface is a $SiO_2$ surface, then electrodes made of Al (50 nm, sputtered, with 5 nm Ti adhesion layer) are preferred, where Ti is used to enhance adhesion to $SiO_2$. Ti and Al can be deposited through two successive depositions, e.g., evaporation steps S10 (without breaking vacuum between the two evaporation steps). Ti is nonetheless optional in that case as Al already exhibits good adhesion to $SiO_2$. However, a thin Ti layer would be needed for metallic electrodes made of metals like Au, Pt, Pd, etc. Excellent results have been obtained with other metals and with Pd in particular. Now, if there are no adverse electrochemical reactions expected at the metallic electrodes (due to the combination of liquid in the flow path and characteristics of the electrical signal applied to the electrodes) then Al is preferred because it is stable under ambient conditions, due to the formation of a self-limiting oxide layer on its surface. If adverse electrochemical reactions are expected, then palladium is preferred due to its excellent chemical stability and ability to hold hydrogen. Gold and platinum may also be used, instead of palladium.

The features shown in FIG. 14 have approximately the following dimensions (in reference to FIG. 14, inset):

Width a of the large electrode: 40 µm;
Width b of the small electrode: 10 µm;
Minimal gap c between (paired) electrodes: 10 µm;
Gap d between a small electrode and the next large electrode: 40 µm;
Pitch e (pattern longitudinal length): 100 µm;
Lateral extension f of electrodes beyond the bottom wall surface: 20 µm;
Channel width g: 200 µm; and
Gap h between channel edge to orthogonal connection line (comb): 50 µm.

Note that in the SEM image the metallic patterns and electrodes appear bright, whereas in the sketch the metal and electrodes correspond to the dark areas.

Finally, possible configurations of the electrodes in the channel 20 are described. Referring to FIGS. 12-14: a microfluidic microchannel 20 (defining a flow path 22) may exhibit lateral slanted walls 22a, 22b. As seen in FIG. 12, electrodes (e.g., connected to a dielectrophoresis (DEP) or an EO circuit may be configured as a multiwall electrode, i.e., electrodes 50 extend at least partly across the bottom (hydrophilic) surface (bottom wall 20c) and one (or each) of the slanted (hydrophilic) walls 20a-b, flush with surrounding surface 30. That is, the exposed surface of an electrode is level with a surrounding surface 30, as explained earlier. For DEP and EO application, a minimum periphery covered by an electrode is preferably the following: an electrode shall at least extend through: (i) one slanted lateral wall (20a or 20b) plus (ii) at least partially transverse across the bottom wall 20c. When electrodes cover more than half the width of the bottom wall, then opposite electrodes become interdigitated. The resulting, effective EO or DEP force experienced by particles p will in that case be mostly parallel to the flow path, as desired in some applications. However, note that an EO or DEP force not parallel to the flow path can be created by limiting the extension of the electrodes across the bottom wall. This can be done by having both opposite electrodes aligned and separated by a gap of for example 10 micrometers. In this case, a local EO flow can be created for mixing purposes or a local DEP force can be created for trapping particles at a particular location of the flow path.

The above embodiments have been succinctly described in reference to the accompanying drawings and may accommodate a number of variants. Several combinations of the above features may be contemplated. Examples are given in the next section.

3. Specific Embodiments/Technical Implementation Details

3.1 Chronological Description of FIGS. 1-11

A chronological description of a complete fabrication method is now given, in reference to FIGS. 1-11, corresponding to respective steps S1-S11, and in accordance with preferred embodiments.

Step S1: a silicon wafer 10 is provided, that exhibits <100> crystallographic orientation;

Step S2: Thermal oxidation is performed ($SiO_2$ growth): a $SiO_2$ layer 12 is obtained;

Step S3: Photolithography steps are carried out, to obtain a resist layer 14 covering selected regions R1 of layer 12, such that remaining regions R2 of layer 12 are not covered by the resist layer 14. As usual, photolithography may involve HDMS priming, photoresist spin-coating, soft-bake, exposure, development, etc. The exposure dose, the development time, and electrode patterns may need to be optimized and pattern correction on mask level is desired to minimize subsequent problems, as known per se in photolithography;

Step S4: the $SiO_2$ mask etching can be done by dry (plasma) or wet etching. Wet etching (BHF) is preferred for reasons discussed in the previous section;

Step S4a: wafer preparation includes a step of photoresist removal (wet or dry), and a short BHF dip to remove the native oxide (beyond oxide already etched in Step S4), followed by rinsing with deionized water;

Step S5: then, anisotropic silicon etching is carried out using TMAH, KOH or EDP. TMAH is preferred since it has higher selectivity over the $SiO_2$ mask, also it does not contaminate the wafer;

Step S6: $SiO_2$ mask removal can be done by dry (plasma) or wet etching. Wet etching (BHF) is preferred for reasons discussed in the previous section;

Step S7: Thermal oxidation is performed again (the wafer is cleaned from metal and organic contaminants prior to oxidation), now to obtain a uniform, hydrophilic layer 30, covering notably the microstructures 20;

Step S8: Photolithography steps are performed again, now for obtaining a resist layer 40 covering selected portions P1 of the $SiO_2$ 30. A closed chamber coating system is preferred for more conformal photoresist coverage;

Step S9: Partial $SiO_2$ etching is done in BHF to partially etch the surface of the remaining portion P2 of layer 30 and create recesses/undercuts 40r, 40u under the resist 40. This creates an undercut and a recess on the $SiO_2$ layer. The etch depth approximately corresponds to the thickness of metal deposited in next step;

Step S10: Metal deposition follows; and

Step S11: The photoresist is etched (lift-off) in an organic solvent, where the metal on the photoresist is lifted-off, leaving metal only inside the patterned regions P2.

3.2 Covering the Chip

After step S11, the wafer can be placed on a supporting tape for dicing, the front-side can be protected by a photoresist layer or a tape. At this point, microstructures can still be rinsed, cleaned and dried.

The microfluidic chip can subsequently be covered. In preferred variants, a cover-film is applied to cover the microfluidic structures and possibly complete them (e.g., close channels 20), before dicing.

The cover-film may be applied to cover several chips fabricated in parallel on a same wafer, which is advantageous for large scale fabrication. The cover film 62 is thus applied at substrate-level, after cleaning, and before singulation in that case. The cover film 62 must therefore be distinguished from a protective (photoresist) film that can otherwise be applied before dicing.

Indeed, protective films are usually applied before dicing to protect a processed wafer. Since here the cover film 62 is applied after cleaning (e.g., after having rinsed, cleaned and dried the partially cut substrate), clean microfluidic structures are obtained for the whole assembly, i.e., at substrate level, a thing that usually is only carried out at chip level. Once the exposed surface is sealed with the cover film 62, the assembly can be singulated and the resulting dies can be readily used.

Several materials can be contemplated for the cover-film: Of particular interest are dry-film resists (usually optically clear), such as polyepoxide films, which have been found to be best suited for several applications. They notably are rigid enough to tent over the channels 20 without collapsing. They can be easily diced and have good adhesion to the surface to prevent delamination and leaking. Most practical is to use a cover film initially provided as a laminate sheet to apply it on the surface of the substrate. In variants, any rigid enough cover film can be contemplated, like silicon or thin glass (its Young's modulus is typically between 4 and 200 gigapascal). If an optical clear material is required, glass can be used.

According to many test performed by the inventors, best results are obtained if the thickness of the dry-film resist 62 applied is between 10 and 100 µm. Satisfactory results were obtained with 14 µm thick films but optimal results were obtained for thicknesses of about 50 µm (±20 µm), the film itself may shall preferably exhibit less than 5% thickness variation.

Sealing is critical for applications that require preventing evaporation and crosstalk of liquids/samples/reagents across different microfluidic structures. Elastosmers such as PDMS were found to contaminate the microfluidic structures, making them hydrophobic due to the surface diffusion of low molecular weight siloxanes. While chips covered with PDMS were useful for experiments and developing the technology, these chips may not have sufficiently long shelf lifetime stability for optimal logistics that is required in diagnostics. When optical transparency, chemical stability, low auto-fluorescence in specific optical regions used for fluorescence assays, conformability with surfaces, mechanical strength, water and air non-permeability become critical requirements, then dry-film resists are better suited, being particularly adapted to the sealing of microfluidic structures as fabricated here.

Dry-film resists are more challenging to laminate after they have been photo-exposed. Also, if they are photo-patterned after lamination, liquids such as the developing and rinsing solutions might contaminate microfluidic structures. Therefore, it is preferable to define holes (e.g. for defining loading pads and vents) in the sealing layer before lamination. This can be done by cutting, laser ablation or local photo-patterning, for example.

More generally, present methods may be completed by any one (or more) of the following steps/comprise one or more of the following features:
applying a cover-film 62, the applied cover film covering the chip 1, and notably said portion P1 of the electrically insulating layer adjoining a contiguous portion P2 of the electrically conductive layer 50;
the chip may have several blocks, each comprising one or more microfluidic structures on face F of the substrate;
the applied cover-film 62 may cover all of said several blocks;
the cover-film applied is a dry-film resist 62, and, preferably, the cover-film fulfills one or more of the following conditions: it comprises an epoxy resin, it is a laminate sheet, and has a Young's modulus between 3 and 5 gigapascal;
The thickness of the dry-film resist 62 applied is between 10 and 100 µm, and preferably between 30 and 70 µm;
applying the cover film 62 may comprise:
providing a film comprising at least two layers, including the cover film 62 and a backing film;
applying the cover film 62 against an exposed surface on said face F of the substrate by pressing the backing film, preferably by laminating the backing film; and
removing the backing film; and
providing this film may further comprise patterning the cover film 62, preferably by one of: photolithography; cutting; punching; or laser ablation, prior to applying the patterned cover film 62, to obtain a cover film 62 that comprises openings 62o (see FIG. 12) forming patterns corresponding to structures of the microfluidic chip assembly already present or to be subsequently fabricated.

3.3 Specific Embodiment and Application

Additional technical details follow which concern concrete examples of fabrication and application.

The chip measures 23×9.3 mm$^2$ and comprises a loading pad, a microchannel with embedded electrodes, a capillary pump, air vents, a cover film and electrical contacts mating with a card-edge socket. Silicon substrate is used to leverage the micromachining processes as well as the favorable properties of Si and $SiO_2$, such as channel etching with tapered sidewall profile, hydrophilicity of $SiO_2$ for capillary filling, thermal and chemical stability, mechanical robustness, compatibility of $SiO_2$ surface with many biomolecules, and well defined and reliable chemical composition.

In the fabrication process, channels are anisotropically etched in silicon using TMAH 25% aqueous solution at 100° C. and electrically passivated by thermal oxidation after piranha cleaning (1:1 mixture of sulfuric acid and hydrogen peroxide). The electrodes were patterned by metal evaporation and lift-off after conformal coating and patterning of a single-layer positive-tone photoresist (AZ4562) at 2500 rpm in a closed chamber coating system. The resist is exposed to UV light (365 nm) through a photomask in hard-contact mode and developed in 1:3 mixture of AZ400K and DI water. Prior to metal deposition, a short isotropic $SiO_2$ etching is introduced to assist lift-off and to recess the electrodes. The photolithography parameters are optimized to achieve at least a 5-µm minimum feature size in 20 µm deep trenches. Following the dicing and cleaning steps, a hydrophilic dry-film cover is laminated at 45° C. to seal the microfluidic structures. SEM inspection showed that the cover film perfectly tents over the channels and over the capillary pump. The electrodes showed minimized edge defects and very flat surface topography owing to the $SiO_2$ recessing step.

Functionality of the above chip was demonstrated by trapping beads in a liquid filling the chip by capillarity. 10 μm diameter polystyrene beads were suspended in a 1× Tris-EDTA buffer and pipetted to the loading pad while 10 Vpp potential at 1 MHz was applied to the electrode set. The buffer solution filled the channels and pulled the beads towards the DEP trapping region. Beads were trapped on the first electrodes and distributed to the other electrodes by tuning the potential. The experiments showed autonomous flow generation and reproducible bead trapping. The combination of conformal electrode patterning and capillarity-compatible channel fabrication may extend the application areas of advanced and autonomous microfluidic chips for a range of electrokinetics phenomena without adding excessive complexity in design and fabrication.

3.4. Final Remarks

Methods described herein can be used in the fabrication of wafer-based microfluidic chips. The resulting chips can notably be distributed by the fabricator in raw wafer form (that is, as a single wafer that has multiple unpackaged chips), as a bare die, or in a packaged form. In the latter case a chip is mounted in a single chip package (such as a plastic carrier) or in a multichip package. In any case the chip can then be integrated with other chips, or other microfluidic elements (tubing ports, pumps, etc.) even if applications to autonomous chips are preferred, as part of either (a) an intermediate product or (b) an end product.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials could be used for the resist 40 and for the cover-film 62.

The invention claimed is:

1. A microfluidic chip comprising:
   a substrate exhibiting one or more microstructures machined on a face of the substrate, the one or more microstructures comprising grooved microfluidic microchannels, the grooved microfluidic microchannel defining sidewalls;
   an electrically insulating layer covering at least partially said face, said electrically insulating layer having one or more residual voids comprising a recess, an undercut, or both a recess and undercut;
   an electrically conductive layer covering at least partly the electrically insulating layer, and preferably covering the electrically insulating layer over an area extending at least partly over of the one or more microstructures including a sidewall thereof, the electrically conductive layer abutting a contiguous portion of the electrically insulating layer subject to the recess, the undercut, or both the recess and undercut,
   wherein an exposed surface of the electrically conductive layer is adjoining, preferably level with, an exposed surface of a contiguous portion of the electrically insulating layer, the misalignment between said exposed surfaces being more preferably less than 20 nm, and even more preferably less than 10 nm.

2. The microfluidic chip of claim 1, wherein the electrically insulating layer covering the substrate provided is an oxide such as $SiO_2$ or a nitride such as $Si_3N_4$.

3. The microfluidic chip of claim 1, wherein the thickness of the deposited conductive layer is between 20 and 200 nm, more preferably between 30 and 100 nm, and even more preferably between 40 and 60 nm, the deposited electrically conductive layer being preferably one of: a metal, a metallic alloy, or an organic layer.

4. The microfluidic chip of claim 1, wherein the microfluidic microchannel grooved on said face has an average depth of the microchannel being between 5 and 50 micrometers.

5. The microfluidic chip of claim 4, wherein the average depth of the microchannel of the substrate provided is between 10 and 20 micrometers.

6. The microfluidic chip of claim 1, wherein the microchannel of the substrate provided has slanted sidewalls.

7. The microfluidic chip of claim 1, wherein the substrate is a silicon wafer, said face of the substrate being generally parallel to surfaces of the silicon wafer.

\* \* \* \* \*